US012644175B2

(12) United States Patent
Wong

(10) Patent No.: US 12,644,175 B2
(45) Date of Patent: Jun. 2, 2026

(54) NANOPOROUS GRAPHENE MEMBRANE

(71) Applicant: OSTIA TECHNOLOGIES LIMITED, Salford (GB)

(72) Inventor: Ka Wai Wong, Salford (GB)

(73) Assignee: Ostia Technologies Limited, Salford (GB)

( * ) Notice: Subject to any disclaimer, the term of this patent is extended or adjusted under 35 U.S.C. 154(b) by 0 days.

(21) Appl. No.: 18/316,974

(22) Filed: May 12, 2023

(65) Prior Publication Data

US 2024/0376593 A1 Nov. 14, 2024

(51) Int. Cl.
| | |
|---|---|
| *B32B 9/00* | (2006.01) |
| *C23C 16/01* | (2006.01) |
| *C23C 16/26* | (2006.01) |
| *B33Y 10/00* | (2015.01) |

(52) U.S. Cl.
CPC .............. *C23C 16/01* (2013.01); *C23C 16/26* (2013.01); *B33Y 10/00* (2014.12)

(58) Field of Classification Search
CPC ....... Y10T 428/30; B82Y 30/00; B82Y 40/00; C23C 16/01; C23C 16/26; B33Y 10/00
USPC ........................................................ 428/408
See application file for complete search history.

(56) References Cited

U.S. PATENT DOCUMENTS

| | | |
|---|---|---|
| 2009/0131858 A1 | 5/2009 | Fissell et al. |
| 2009/0258782 A1* | 10/2009 | Gogotsi .................. A61P 31/12 |
| | | 502/402 |

| | | |
|---|---|---|
| 2010/0181288 A1 | 7/2010 | Tang et al. |
| 2012/0241069 A1 | 9/2012 | Hofmann et al. |
| 2013/0098835 A1 | 4/2013 | Hinestroza et al. |
| 2013/0160701 A1 | 6/2013 | Arnold et al. |
| 2015/0283513 A1 | 10/2015 | Walavalkar et al. |
| 2018/0021736 A1 | 1/2018 | Fonash et al. |
| 2019/0168485 A1 | 6/2019 | Height et al. |
| 2019/0336932 A1* | 11/2019 | Liu ........................ C01B 13/363 |

FOREIGN PATENT DOCUMENTS

| | | | |
|---|---|---|---|
| CA | 3158273 | * | 5/2021 |
| WO | 2021/121952 A1 | | 6/2021 |

OTHER PUBLICATIONS

Matthew J. Allen, Vincent C. Tung, and Richard B. Kaner, Honeycomb carbon: a review of graphene, Chemistry Reviews, 2010.
Qingkai Yu, Jie Lian, Sujitra Siriponglert, Hao Li, Yong P. Chen, and Shin-Shem Pei, Graphene segregated on Ni surfaces and transferred to insulators, Applied Physics Letters, 2008, 93, 113103.

(Continued)

*Primary Examiner* — Daniel H Miller
(74) *Attorney, Agent, or Firm* — Muir Patent Law, PLLC

(57) ABSTRACT

A nanoporous graphene membrane fabrication method is formed using an array of sacrificial nanopillars of removable materials are printed onto a substrate, and subsequent growth of graphene. After serial deposition of overlayers of even dissimilar nature, the sacrificial nanostructures are dissolved, leaving nanoporous graphene membrane with nanopores, channels and cavities of nanoscale dimension and geometry designed and controlled, enabling untapped and unique functions in different technological areas such as filtration, electronics, and molecular sensors.

14 Claims, 3 Drawing Sheets

(56) References Cited

OTHER PUBLICATIONS

Xuesong Li, Weiwei Cai, Jinho An, Seyoung Kim, Junghyo Nah, Dongxing Yang, Richard Piner, Aruna Velamakanni, Inhwa Jung, Emanuel Tutuc, Sanjay K. Banerjee, Luigi Colombo, and Rodney S. Ruoff, Large-area synthesis of high-quality and uniform graphene films on copper foils, Science, 2009, 324, 1312-1314.

Alfonso Reina, Xiaoting Jia, John Ho, Daniel Nezich, Hyungbin Son, Vladimir Bulovic, Mildred S. Dresselhaus, and Jing Kong, Large area, few-layer graphene films on arbitrary substrates by chemical vapor deposition, Nano Letters, 2009, 9, 30-35.

Yi Zhang, Luyao Zhang, and Chongwu Zhou, Review of chemical vapor deposition of graphene and related applications, Accounts of Chemical Research, 2013, 40(10), 2329-2339.

Kaung-Jay Peng, Chung-Lun Wu, Yung-Hsiang Lin, Yen-Ju Liu, Din-Ping Tsai, Yi-Hao Pai and Gong-Ru Lin, Hydrogen-free PECVD growth of few-layer graphene on an ultra-thin nickel film at the threshold dissolution temperature, Journal of Materials Chemistry C, 2013, 1, 3862-3870.

Lanxia Cheng, Kayoung Yun, Antonio Lucero, Jie Huang, Xin Meng, Guoda Lian, Ho-Seok Nam, Robert M. Wallace, Moon Kim, Archana Venugopal, Luigi Colombo, and Jiyoung Kim, Low temperature synthesis of graphite on Ni films using inductively coupled plasma enhanced CVD, Journal of Materials Chemistry C, 2015, 3, 5192-5198.

Jisu Jang, Myungwoo Son, Sunki Chung, Kihyeun Kim, Chunhum Cho, Byoung Hun Lee, and Moon-Ho Ham, Low-temperature-grown continuous graphene films from benzene by chemical vapor deposition at ambient pressure, Scientific Reports, 2015, 5, 17955.

Steven P. Koenig, Luda Wang, John Pellegrino, and J. Scott Bunch, Selective molecular sieving through porous graphene, Nature Nanotechnology, 2012, 7, 728-732; Recep Zan, Quentin M. Ramasse, Ursel Banger, and Konstantin S. Novoselov, Graphene reknits its holes, Nano Letters, 2012, 12, 3936-3940.

Yi Lin, Xiaogang Han, Caroline J. Campbell, Jae-Woo Kim, Bin Zhao, Wei Luo, Jiaqi Dai, Liangbing Hu, and John W. Connell, Holey graphene nanomanufacturing: structure, composition, and electrochemical Properties, Advanced Functional Materials, 2015, 25, 2920-2927.

Yuxi Xu, Chih-Yen Chen, Zipeng Zhao, Zhaoyang Lin, Chain Lee, Xu Xu, Chen Wang, Yu Huang, Muhammad Imran Shakir, and Xiangfeng Duan, Solution Processable Holey Graphene Oxide and Its Derived Macrostructures for High-Performance Supercapacitors, Nano Letters, 2015, 15, 4605-4610.

A. Sinitskii and J. M. Tour, Patterning graphene through the self-assembled templates: toward periodic two-dimensional graphene nanostructures with semiconductor Properties, Journal of American Chemical Society, 2010, 132, 14730-14732.

Ji Feng, Wenbin Li, Xiaofeng Qian, Jingshan Qi, Liang Qi, and Ju Li, Patterning of graphene, Nanoscale, 2012, 4, 4883-4889.

C. Moreno, M. Vilas-Varela, B. Kretz, A Garcia-Lekue, M. V. Costache, M. Paradinas, M. Panighel, G. Ceballos, S. O. Valenzuela, D. Peña, A. Mugarza, Bottom-up synthesis of multifunctional nanoporous graphene, Science, 2018, 360, 199-203.

Marco Bieri, Matthias Treier, Jinming Cai, Kamel Aït-Mansour, Pascal Ruffieux, Oliver Gröning, Pierangelo Gröning, Marcel Kastler, Ralph Rieger, Xinliang Feng, Klaus Müllen, and Roman Fasel, Porous graphenes: two-dimensional polymer synthesis with atomic precision, Chemical Communications, 2009, 6919-6921.

G. F. Schneider, S. W. Kowalczyk, V. E. Calado, G. Pandraud, H. W. Zandbergen, L. M. K. Vandersypen, and C. Dekker, DNA translocation through graphene nanopores, Nano Letters, 2010, 10, 3163-3167.

S. Garaj, S. Liu, J. A. Golovchenko, and D. Branton, Molecular-hugging graphene nanopores, Proceedings of National Academy of Science, 2013, 110, 12192.

K. Celebi, J. Buchheim, R. M. Wyss, A. Droudian, P. Gasser, I. Shorubalko, J.-I. Kye, C. Lee, and H. G. Park, Ultimate permeation across atomically thin porous graphene, Science, 2014, 344, 289-292.

Z. Du, W. Ai, C. Sun, C. Zou, J. Zhao, Y. Chen, X. Dong, J. Liu, G. Sun, T. Yu, and W. Huang, Engineering the Li storage properties of graphene anodes: defect evolution and pore structure regulation, ACS Applied Materials & Interfaces, 2016, 8, 33712-33722.

D. Dutta, J.-Y. Jiang, A. Jamaluddin, S.-M. He, Y.-H. Hung, F. Chen, J.-K. Chang, and C.-Y. Su, Nanocatalyst-assisted fine tailoring of pore structure in holey-graphene for enhanced performance in energy storage, ACS Applied Materials & Interfaces, 2019, 11, 36560-36570.

G. Ning, Z. Fan, G. Wang, J. Gao, W. Qian, and F. Wei, Gram-scale synthesis of nanomesh graphene with high surface area and its application in supercapacitor electrodes, Chemical Communications, 2011, 47, 5976-5978.

C. Tang, B.-Q. Li, Q. Zhang, L. Zhu, H.-F. Wang, J.-L. Shi, and F. Wei, CaO-templated growth of hierarchical porous graphene for high-power lithium-sulfur battery applications, Advanced Functional Materials, 2016, 26, 577-585.

K. S. Novoselov, A. K. Geim, S. V. Morozov, D. Jiang, M. I. Katsnelson, I. V. Grigorieva, S. V. Dubonos, A. A. Firsov, Two-dimensional gas of massless Dirac fermions in graphene, Nature, 2005, 438, 197-200.

I. Meric, M. Y. Han, A. F. Young, B. Ozyilmaz, P. Kim, K. L. Shepard, Current saturation in zero-bandgap, topgated graphene field-effect transistors, Nature Nanotechnology, 2008, 3, 654-659.

Jian Wei You, Zhihao Lan, and Nicolae C. Panoiu, Four-wave mixing of topological edge plasmons in graphene metasurfaces, Science Advances, 2020; 6 : eaaz3910.

Bashir Fotouhi, Vahid Ahmadi, Mostafa Abasifard, and Ramin Roohi, Interband ? plasmon of graphene nanopores: a potential sensing mechanism for DNA nucleotides, The Journal of Physical Chemistry, 2016, 120, 13693-13700.

Shuangbao Lyu, Yongliang Zhang, Guanghua Du, Cuixia Di, Huijun Yao, Yulong Fan, Jinglai Duana, and Dangyuan Leid, Double-sided plasmonic metasurface for simultaneous biomolecular separation and SERS detection, Spectrochimica Acta Part 1: Molecular and Biomolecular Spectroscopy, 2023, 285, 121801.

Micron 3D Printer PTM-2/PTM-2/PTM-5/PTM-10, Shenzhen Phenix Tech Co., Ltd., CopyRight 2020 Shenzhen Phenix Tech Co., Ltd, downloaded Feb. 2023 https://phenix81.com/plus/view.php?aid=26International.

Society of Nephrology. Global Kidney Health Atlas. https://www.theisn.org/ initiatives/global-kidney-health-atlas. Updated 2019. Accessed Feb. 4, 2022.

Hamid Rabb, Kyungho Lee, and Chirag R. Parikh, Beyond kidney dialysis and transplantation: what's on the horizon?, The Journal of Clinical Investigation, 2022 13(7):e159308.

Xin Zhang, Aiguo Han and Yongan Yang, Review on the production of high-purity lithium metal, Journal of Materials Chemistry A 2020, 8, 22455-22466.

Dong Hee Lee, Taegong Ryu, Junho Shin, Jae Chun Ryu. Kang-Sup Chung and Young Ho Kim, selective lithium recovery from aqueous solution using a modified membrane capacitive deionization system 2017, 173, 283-288.

M. Pasta, C. D. Wessells, Y. Cui, F. La Manita, "A desalination battery", Nano Letters 2012, 12, 839-843.

Daniel Waldmann et al., "Robust Graphene Membranes in a Silicon Carbide Frame", ACS Nano, vol. 7, No. 5, May 28, 2013 (May 28, 2013), pp. 4441-4448, XP055683209, ISSN: 1936-0851, DOI: 10.1021/nn401037c.

International Search Report and Written Opinion mailed on Oct. 22, 2024, for international application No. PCT/IB2024/000236.

Jena Rahul et al., "Current status and future of artificial kidney in humans", Indian Journal of Nephrology, vol. 32, No. 6, Jan. 1, 2022, p. 531, XP093212573, ISSN: 0971-4065, DOI: 10.4103/ijn.ijn_240_21, URL:https://www.ncbi.nlm.nih.gov/pmc/articles/PMC9872927/pdf/IJN-32-531.pdf.

Maria Berdova et al., "Exceptionally strong and robust millimeterscale graphene-alumina composite membranes", Nanotechnology, Institute of Physics Publishing, Bristol, GB, vol. 25, No. 35, Aug. 12, 2014, p. 355701, XP020269365, ISSN: 0957-4484, DOI: 10.1088/0957-4484/25/35/355701.

(56)          References Cited

OTHER PUBLICATIONS

International Search Report dated Nov. 6, 2024, for International
Patent Application No. PCT/IB2024/000237 (15 pages).

\* cited by examiner

NANOPOROUS GRAPHENE MEMBRANE

BACKGROUND

Technical Field

The disclosed technology pertains to nanoporous graphene membrane fabrication and related applications with controllable pore size, morphology, density and distribution.

Background Art

Nanoporous membranes are becoming a critical component in many different fields, from more traditional electronics, biomedical and chemical applications such as electrochemical storage devices, desalination, and chemical separation, to more frontier areas such as bioartificial organs, tissue engineering and nanophotonics.

A passive nanoporous membrane can separate or filter nano-sized entities from a mixture regardless of their material nature (organic, inorganic, or biological). Such nanoporous membranes are already an important element in many applications; however, if the nanoporous membrane possesses components through which external stimulus or excitation can be applied, it becomes an active one, offering tunable and controllable characteristics and enabling more sophisticated applications.

Nanoporous membranes are conventionally prepared by several techniques. Micro machining (e.g., CNC machining, turning, milling, micro-electrical discharge machining) is a traditional machining technology but can only reach a feature dimension and resolution of μm or sub-μm level. Also, materials suitable for such machining are primarily limited to metals and ceramics.

Chemical etching methods such as ion-track etching, anodizing, and more recently, controlled break down etching, can only generate nanopores with a relatively wide size distribution. Further, the nanopores generated are randomly distributed within a membrane. Active components such as an electrode or on-chip circuit cannot be pre-designed and finally fabricated. On the other hand, many chemically etched nanoporous membranes are polymer-based. As heterogeneous elements, for instance, metal electrodes are difficult to include.

For the purposes of the present disclosure, heterogeneous means that the material is not the same physically throughout its bulk. Therefore, they usually serve as a passive membrane. Extra physical input such as electrical potential, heat, and light cannot be easily incorporated to generate additional and desirable interaction with surroundings, and thus to broaden its functionality and application scope.

General lithographic and nanoscale fabrication techniques (e.g., atomic layer deposition, scanning force lithography, nanoimprint, dip-pen nanolithography) can create a nanoscale pattern and nanocavity, which are alternative ways to prepare nanoporous membranes, but they are generally applicable on the fabrication of a thin film structure. High-aspect ratio nanoscale features, for example vials, channels, reservoirs, and compartments, cannot be easily prepared. Moreover, the corresponding processes are usually complicated, costly, labour intensive, and in some cases very difficult to scale up.

Owing to the rapid advancement of nanoscience and nanotechnology in the past decade, nanoporous membranes can also be formed using nanoparticles, nanotubes, nanowires, and other nanostructures. These methods of forming a nanoporous membrane cannot be readily used. On the other hand, as the equipment and nanomaterials involved are usually uniquely designed and manufactured at the laboratory level, they are difficult to reproduce in mass scale, rendering production very challenging, if not impossible.

There are globally 2.6 million patients that receive renal replacement therapy with either dialysis or a kidney transplant, which is expected to double by 2030 (International Society of Nephrology, Global Kidney Health Atlas, https://www.theisn.org/initiatives/global-kidney-health-atlas, updated 2019; Accessed Feb. 4, 2022). Owing to this demand, a bioartificial kidney is one of the most sought-after technologies in medical science, since the invention of the first dialysis machine in 1943 by Willem Kolff. In particular, a wearable and implantable bio-artificial kidney has the potential to provide continuous dialysis throughout the day (Hamid Rabb, Kyungho Lee, and Chirag R. Parikh, *Beyond kidney dialysis and transplantation: what's on the horizon?*, The Journal of Clinical Investigation, 2022 13 (7): e159308). In this regard, a nanoporous membrane is one of the key components for a wearable and implantable bio-artificial kidney.

Graphene is an allotrope of carbon in which the carbon atoms are $sp^3$-hybridized and arranged in a honeycomb-like hexagonal lattice structure. The unique atomic arrangement of graphene, in which each carbon atom is connected with three neighboring carbon atoms with strong σ-bonds and offers the remaining valence electron for long-range π-bond conjugation, results in delocalization of electrons over the entire 2-dimensional (2D) layer of carbon atoms. This unique structure confers on graphene extraordinary thermal, mechanical, and electrical properties, which have been the interest of both theoreticians and experimentalists pursuing unprecedented applications with this 2D material since its discovery in 2004 by Andre Geim and Konstantin Novoselov, who first isolated single-layer samples from graphite. (Matthew J. Allen, Vincent C. Tung, and Richard B. Kaner, *Honeycomb carbon: a review of graphene*, Chemistry Reviews, 2010 (110), 132-145)

Chemical vapor deposition (CVD) has been a widely accepted method to synthesize graphene since the early reports in 2008 and 2009 (Qingkai Yu, Jie Lian, Sujitra Siriponglert, Hao Li. Yong P. Chen, and Shin-Shem Pei, *Graphene segregated on Ni surfaces and transferred to insulators*, Applied Physics Letters, 2008, 93, 113103; Xuesong Li, Weiwei Cai, Jinho An, Seyoung Kim, Junghyo Nah, Dongxing Yang, Richard Piner, Aruna Velamakanni, Inhwa Jung, Emanuel Tutuc, Sanjay K. Banerjee, Luigi Colombo, and Rodney S. Ruoff, *Large-area synthesis of high-quality and uniform graphene films on copper foils*, Science, 2009, 324, 1312-1314; Alfonso Reina, Xiaoting Jia, John Ho, Daniel Nezich, Hyungbin Son, Vladimir Bulovic, Mildred S. Dresselhaus, and Jing Kong, *Large area, few-layer graphene films on arbitrary substrates by chemical vapor deposition*, Nano Letters, 2009, 9, 30-35). Briefly, a metal substrate, e.g., Ni, Cu, and other transition metals is used, upon which graphenes can be grown in different CVD conditions. Monolayer and few-layer graphene can be prepared on polycrystalline Ni, while the use of single-crystalline Ni (111) substrate can substantially increase the percentage of monolayer graphene grown. When the Cu substrate is used instead, single-layer graphene can be prepared. Zhang et. al. has made a good review on CVD graphene (Yi Zhang, Luyao Zhang, and Chongwu Zhou, *Review of chemical vapor deposition of graphene and related applications*, Accounts of Chemical Research, 2013, 40 (10), 2329-2339).

Various low-temperature syntheses of graphene have been demonstrated. Plasma enhanced CVD methods were shown to be able to prepare graphene film at growth temperature as low as 380° C. to 500° C. (Kaung-Jay Peng, Chung-Lun Wu, Yung-Hsiang Lin, Yen-Ju Liu, Din-Ping Tsai, Yi-Hao Pai and Gong-Ru Lin, *Hydrogen-free PECVD growth of few-layer graphene on an ultra-thin nickel film at the threshold dissolution temperature*, Journal of Materials Chemistry C, 2013, 1, 3862-3870; Lanxia Cheng, Kayoung Yun, Antonio Lucero, Jie Huang, Xin Meng, Guoda Lian, Ho-Seok Nam, Robert M. Wallace, Moon Kim, Archana Venugopal, Luigi Colombo, and Jiyoung Kim, *Low temperature synthesis of graphite on Ni films using inductively coupled plasma enhanced CVD*, Journal of Materials Chemistry C. 2015, 3, 5192-5198). Jang et. al. reported a low-temperature synthesis of continuous graphene by a modified CVD method with benzene on Cu at an even lower temperature of 100° C. to 300° C. was developed and reported (Jisu Jang, Myungwoo Son, Sunki Chung, Kihyeun Kim, Chunhum Cho, Byoung Hun Lee, and Moon-Ho Ham, *Low-temperature-grown continuous graphene films from benzene by chemical vapor deposition at ambient pressure*, Scientific Reports, 2015, 5, 17955).

Along the research development of graphene, nanoporous graphene emerges to attract enormous attention because of its distinctive material properties, and huge potential in electronics, photonics, catalysis, molecular separation, etc. These alluring properties and prospects are determined by their structural regularity and homogeneity, which are strongly associated with pore characteristics, for instance, size, morphology, and distribution. It is noted, however, with the current fabrication technologies, mass, scalable and low cost production of nanoporous graphene present serious challenges to the development and productization of nanoporous graphene.

Beam techniques (electrons, ions) and laser irradiation are used to engrave pores on pristine graphene; however, the pores produced are irregular and/or size uncontrollable (Steven P. Koenig, Luda Wang, John Pellegrino, and J. Scott Bunch, *Selective molecular sieving through porous graphene*, Nature Nanotechnology, 2012, 7, 728-732; Recep Zan, Quentin M. Ramasse, Ursel Banger, and Konstantin S. Novoselov, *Graphene reknits its holes*, Nano Letters, 2012, 12, 3936-3940).

Nanoporous graphene can also be prepared by using chemical etching method, but the pores are difficult to scale down in the nanoscale range (Yi Lin, Xiaogang Han, Caroline J. Campbell, Jae-Woo Kim, Bin Zhao, Wei Luo, Jiaqi Dai, Liangbing Hu, and John W. Connell, *Holey graphene nanomanufacturing: structure, composition, and electrochemical Properties*, Advanced Functional Materials, 2015, 25, 2920-2927; Yuxi Xu, Chih-Yen Chen, Zipeng Zhao, Zhaoyang Lin, Chain Lee, Xu Xu, Chen Wang, Yu Huang, Muhammad Imran Shakir, and Xiangfeng Duan, *Solution Processable Holey Graphene Oxide and Its Derived Macrostructures for High-Performance Supercapacitors*, Nano Letters, 2015, 15, 4605-4610).

Synthesis of nanoporous graphene has also been achieved with micro- and nano-particles (A. Sinitskii and J. M. Tour, Patterning graphene through the self-assembled templates: toward periodic two-dimensional graphene nanostructures with semiconductor Properties, Journal of American Chemical Society, 2010, 132, 14730-14732; Ji Feng, Wenbin Li, Xiaofeng Qian, Jingshan Qi, Liang Qi, and Ju Li, *Patterning of graphene*, Nanoscale, 2012, 4, 4883-4889). The control of pore morphology, density and distribution of pores are restricted, limited the application scope of the fabricated nanoporous graphene.

Recently, some special bottom-up approaches have been used to preparing nanoporous graphene; however, the fabrication methods are relatively complicated, making large-scale production for further applications very difficult and costly (C. Moreno, M. Vilas-Varela, B. Kretz, A Garcia-Lekue, M. V. Costache, M. Paradinas, M. Panighel, G. Ceballos, S. O. Valenzuela, D. Peña, A. Mugarza, *Bottom-up synthesis of multifunctional nanoporous graphene*, Science, 2018, 360, 199-203; Marco Bieri, Matthias Treier, Jinming Cai, Kamel Aït-Mansour, Pascal Ruffieux, Oliver Gröning, Pierangelo Gröning, Marcel Kastler, Ralph Rieger, Xinliang Feng, Klaus Müllen, and Roman Fasel, *Porous graphenes: two-dimensional polymer synthesis with atomic precision*, Chemical Communications, 2009, 6919-6921).

It is desired to provide a method for producing a nanoporous graphene membrane, with controllable pore size, position, and density, and to provide the corresponding material.

SUMMARY

Fabrication of nanoporous graphene membrane is performed by printing nanopillars of removable material on a substrate, followed by growing graphene on the substrate. The nanopillars are then removed to produce the nanoporous membrane.

A nanoporous graphene membrane is fabricated by printing nanopillars of removable material on a substrate, performing direct chemical vapor deposition (CVD) of graphene, and removal of the nanopillars to produce the nanoporous graphene membrane. The nanopillar material may comprise a removable material, in which the material is removable by one or more of a solvent, heat, chemical treatment, and physical treatment.

In one configuration, the nanopillars are printed or deposited, for example by using 3D printing, nano-imprint, dip-pen lithography, laser writing or another suitable printing technique. By way of non-limiting example, the material is printed or deposited at an aspect ratio having a height-to-width ratio of 3 to 100.

BRIEF DESCRIPTION OF THE DRAWINGS

The descriptions that follow are further understood when read with the appended drawings. There are shown in the drawings exemplary embodiments of the disclosed technology for illustration purpose. The invention is not limited to the specific methods, compositions, and devices disclosed. Further, the drawings are not necessarily drawn to scale or proportion.

DETAILED DESCRIPTION

Overview

Figure 1:
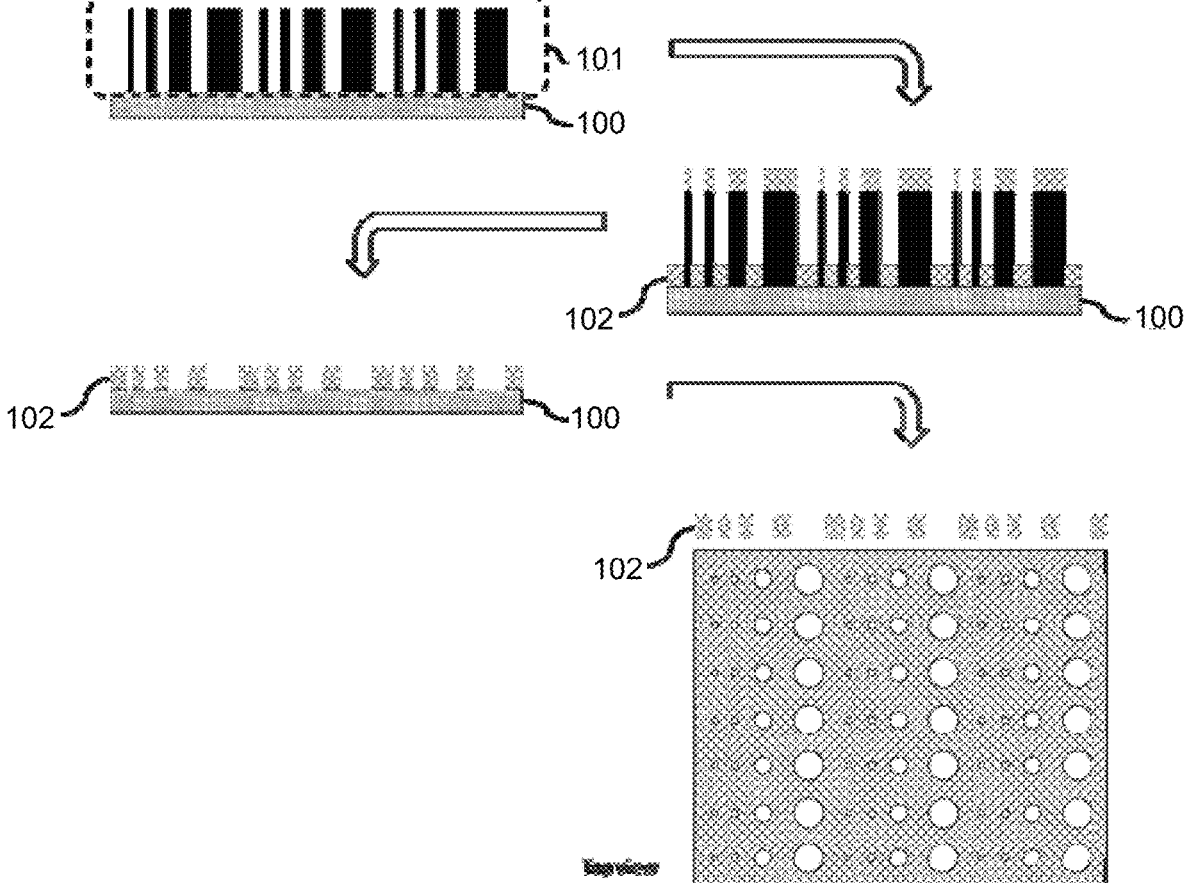
FIG. 1 is a schematic diagram illustrating a fabrication process of free-standing nanoporous graphene membrane using the disclosed technique.

The disclosed technique was devised to overcome the problems and challenges concerning the fabrication of nanoporous graphene membranes. The following detailed description with reference to the drawings illustrates the spirit and essence of the disclosed technique. The illustrative embodiments and examples in the description, drawing, and claims are not meant to be limiting. Other embodiments may be utilized, and other changes may be made, without departing from the spirit of the subject matter presented here.

The disclosed technology pertains to a nanoporous membrane fabrication method and related applications. An array of sacrificial nanopillars of removable materials are printed onto a substrate that can facilitate or catalyze graphene synthesis, for instance, Ni and Cu. Graphene is then synthesized on the substrate surface through chemical vapor deposition (CVD) techniques. Depending on the nature of substrate and processing condition, monolayer and/or few-layer (thin film) graphene can be prepared. Afterwards, when the sacrificial nanostructures are dissolved, a free-standing nanoporous graphene membrane is formed. If a supported graphene is required, another supporting layer can be further deposited onto the graphene formed after graphene synthesis. The supporting layer can be metal, non-metal, organic, inorganic and biomaterial, or a combination of these materials. Further, additional layers for extra functions or properties can be deposited.

In one configuration, the material printed as nanopillars is a removable material. The nanopillar layer may be removed by solvent, by heat, chemical treatment, physical treatment, or a combination of these techniques. The supporting layer deposited onto the graphene/substrate with nanopillars can be metal, non-metal, organic, inorganic and biomaterial, or a combination of these materials. The overlayer can be deposited by spincasting, chemical deposition and physical deposition. The resulting nanoporous graphene membrane may be used to provide one or more layers functionalized for different purposes such as, but not limited to, drug delivery, antibacterial, antimicrobial, electrical, and optical functions.

The nanopillars can be printed or deposited using 3D printing, nano-imprint, dip-pen lithography, laser writing or any other suitable printing technique. The printing technique used can be any technique capable of printing a high-aspect ratio nanopillar, and may have high-aspect ratio ranges from a height-to-width ratio of 3 to 100.

In another configuration, the nanopillar may have a preferred diameter from 1 nm to 1000 nm, and may have a preferred height from 100 nm to 10,000 nm. The nanopillars may be provided with a cylindrical shape, conical shape, or spherical shape.

The technique may be used for preparing a surface functionalizing an inner wall of nanocavities of the nanoporous membrane, by preparing the nanopillars on a substrate, and exposing the nanopillars on the substrate to a solution containing the self-assemble molecules. The self-assemble molecules in this technique may have one end attached with a chemical functional moiety bestowing the desired surface property that can self-assemble onto the nanopillar surface. The other end is attached with a chemical functional moiety that can self-assemble onto the overlayer surface exposed during removal of nanopillars. The overlayer or overlayers may then be deposited, and nanopillars are removed, to produce the nanoporous membrane with a functionalized inner wall surface.

One end of the self-assemble molecule is attached with a chemical moiety bestowing the desired surface property, and can bind onto the nanopillar surface via weak chemical and/or physical interactions such as but not limited to electrostatic interaction, ionic bonds, weak chemical bonds; these interactions between the self-assemble molecules and the surface of nanopillars can be broken by chemical and/or physical treatment. The ending chemical moiety and/or its adjacent chemical functional groups that attach onto the surface of the nanopillar possesses a desired surface and chemical property of the final inner wall of a pore. The other end of the self-assemble molecules left hanging on the surface of the nanopillars that possesses another chemical functional moiety can bind strongly with the material of the overlayer to be deposited.

In another configuration, surface functionalizing of an inner wall of nanocavities of the nanoporous membrane is performed by preparing the nanopillars on a substrate, in which the precursor solution or material to be printed or deposited as nanopillars on the substrate, is mixed with self-assemble molecules before being printed or deposited onto the substrate surface. The self-assemble molecules have one end attached with a chemical functional moiety that can strongly bind with the overlayer material to be deposited and can attach firmly onto the overlayer material on the inner surface of the pore during removal of nanopillars to produce the nanoporous membrane with the functionalized surface on the inner wall. The other end of the self-assemble molecule is attached with a chemical functional moiety bestowing the desired surface property and is left hanging on the inner wall surface of the pore after removal of nanopillars to produce the nanoporous membrane. The overlayer or overlayers are then deposited and nanopillars are removed to produce the nanoporous membrane with the functionalized surface on the inner wall.

The nanoporous membrane may be used to fabricate a wearable and implantable bioartificial kidney, in which the bioartificial kidney has a multi-layered structure consisting of single or multiple functional overlayers. The nanoporous membrane may be used to provide one or more layers functionalized for different purposes such as, but not limited to, drug delivering, antibacterial, antimicrobial, or electrically conducting functions.

Fabrication Process

FIG. 1 is a schematic drawing illustrating a basic fabrication process of the disclosed technique. On a supporting substrate 100, nanoscale cylindrical or conical pillars 101 can be 3D-printed or fabricated using lithographic techniques, leaving gaps and cavities in between. Compared with lithographic techniques, 3D-printing may have advantages in the disclosed technique because of its ease and lower cost of operation. It also offers a higher degree of freedom and flexibility in designing the nanoscale features. Advantageously, 3D-printing achieves high-aspect ratio nanoscale structures, which is difficult with conventional lithographic techniques. It is noted that this does not mean that the method of preparing the removable layer 101 is limited to 3D-printing. The choice of preparation method does not affect the legitimacy of the disclosed technique within the scope of the present disclosure.

The substrate 100 serves as a support for subsequent preparation of nanopillars, and to facilitate or catalyze graphene synthesis. In non-limiting examples, substrate 100 is made of Ni, Cu or transition metal or others, that can facilitate or catalyze graphene synthesis, which can be amorphous, polycrystalline, or single-crystalline form. Graphene layer 102 is then synthesized on the substrate surface through CVD methods. Depending on the nature of substrate and processing condition, monolayer and/or few-layer graphene can be prepared, different CVD methods can used.

Nanopillars 101 are then dissolved or removed by one or more of a solvent, heat, chemical treatment, and physical treatment. After removal of nanopillars 101, free-standing nanoporous graphene membrane is obtained by a further removal of substrate 100, which is achieved one or more of a solvent, heat, chemical treatment, and physical treatment. If substrate 100 and nanopillars 101 are of the same or similar materials, the dissolution or removal of substrate 100 and nanopillars 101 can be performed simultaneously.

Figure 2:
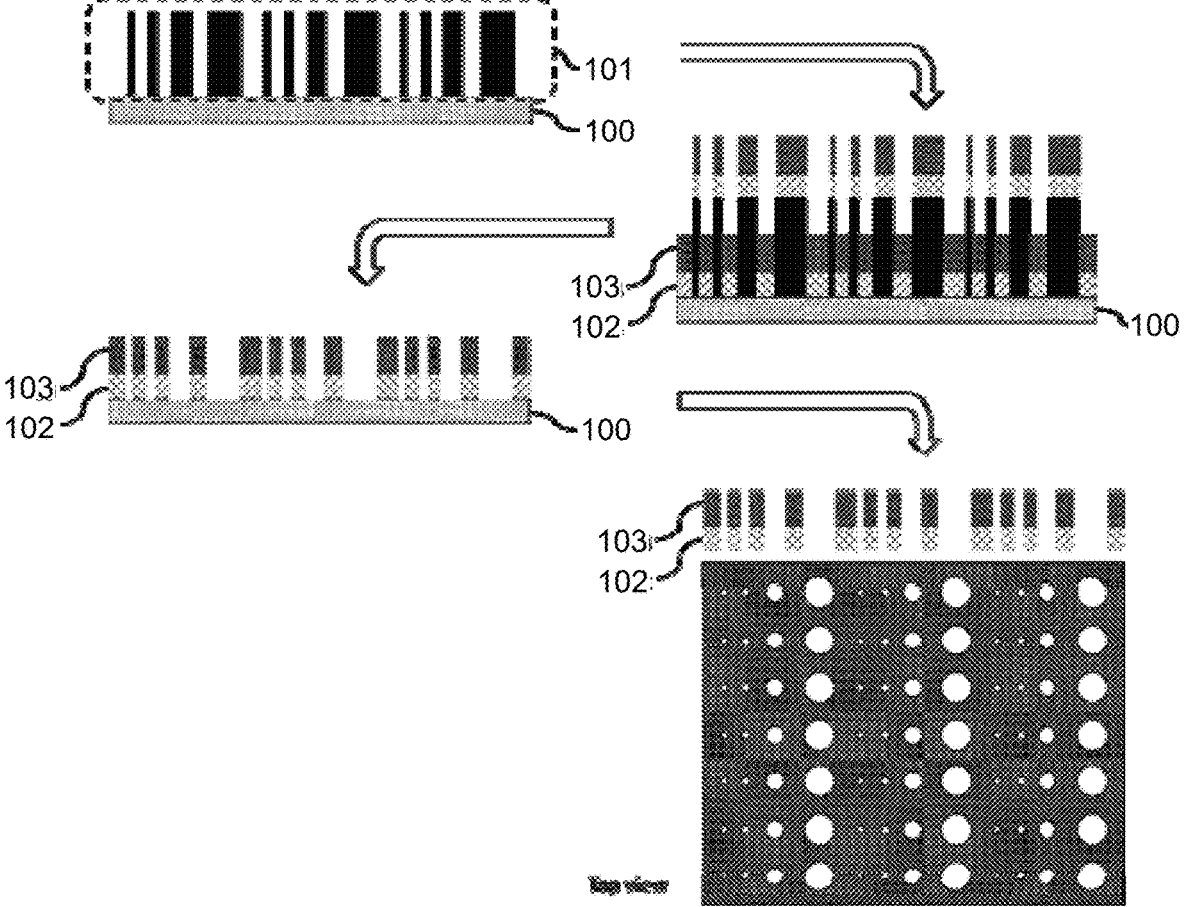
FIG. 2 is a schematic diagram illustrating the fabrication process of supported nanoporous graphene membrane using the disclosed technique.

FIG. 2 is a schematic diagram illustrating the fabrication process of supported nanoporous graphene membrane using the disclosed technique. If a supported nanoporous graphene membrane is required, an additional overlayer 103 is deposited onto the graphene layer before removal of nanopillars 101. The supporting overlayer 103 can be metal, non-metal, organic, inorganic and biomaterial, or a combination of these materials. After subsequent removal of substrate 100 and nanopillars 101, supported nanoporous graphene membrane is obtained.

In another configuration, additional overlayers of materials can be deposited one by one on top of or replacing supporting layer 103, as a stack of multi-layers. The stack can include one or more overlayers of different material nature with different characteristics or functions if they do not react with each other. As such, thin film devices can be constructed around the nanopillars printed or deposited. After subsequent removal of substrate 100 and nanopillars 101, nanoporous multi-layered graphene membrane is obtained.

Advantageously, nanopillars 101 may be made of dissolvable material that can removed by solvent, by heat, or other appropriate treatment. By way of non-limiting example, it can be poly methyl methacrylate (PMMA) that can be removed by a suitable solvent such as acetone. For some materials used in nanopillar layer 101, heat or UV curing may be required to obtain nanopillars strong enough to survive subsequent processes.

After this final treatment, the dimension of the 3D-printed nanopillar would dictate the dimension and morphology of the nanocavity to be constructed. For example, if 100 nm wide circular nanopillars are 3D-printed, cylindrical nanochannels with a diameter of around 100 nm are formed in the nanoporous membrane. As such, there is extremely high manufacturing flexibility and control of the dimension of the nanocavity required in the nanoporous membrane. Hitherto, an advanced commercial 3D printer can already achieve a line width of 50 nm.

Figure 3:
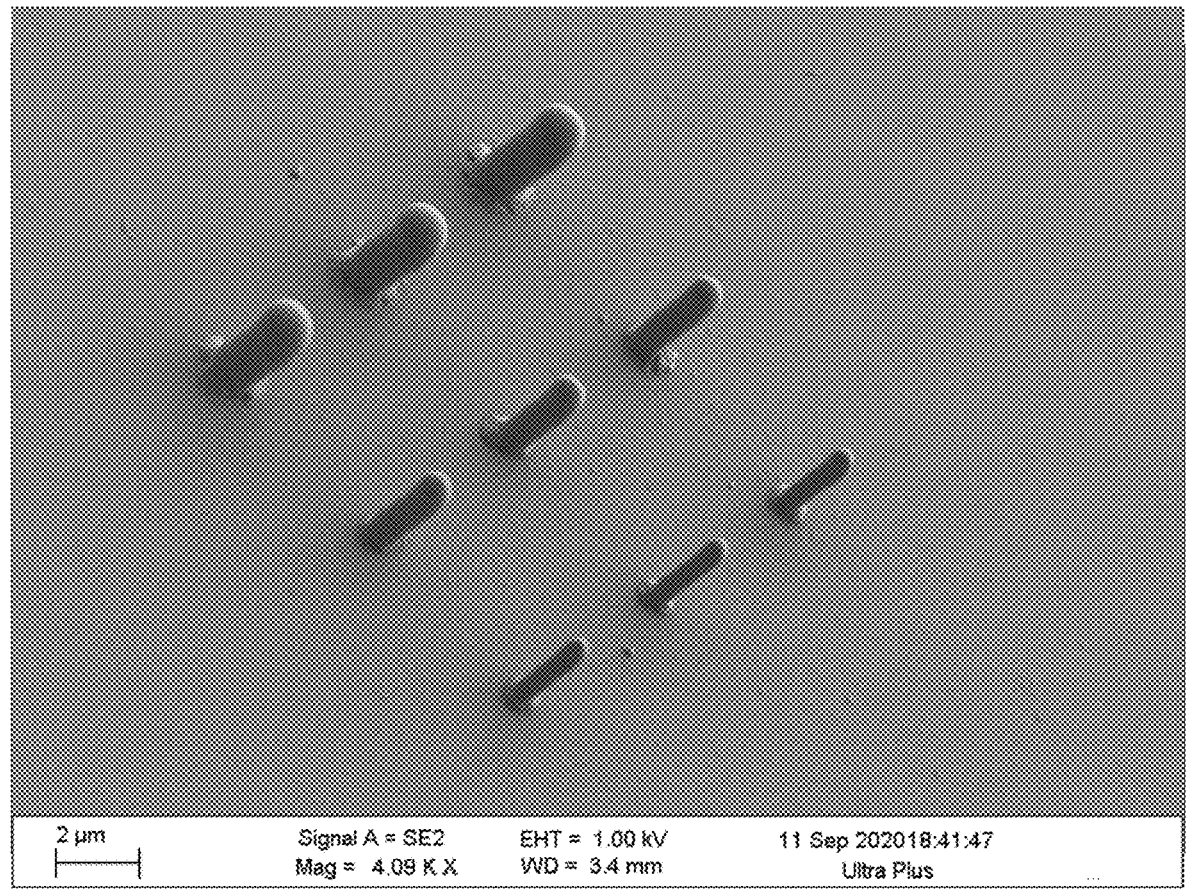
FIG. 3 is a scanning electron micrograph (SEM) image showing an example of photoresist nanopillars prepared by 3D printing.

FIG. 3 is a scanning electron micrograph (SEM) image showing a non-limiting example of photoresist nanopillars prepared by 3D printing. The SEM shows a non-limiting example of a 3×3 array of photoresist nanopillars 3D printed on a silicon substrate. The array has three rows of nanopillars of three diameters: 1125 nm, 750 nm, and 500 nm. All of them have a height of 2 μm.

On the other hand, these nanocavities created will be surrounded by the graphene layer and stacked overlayers left behind, which can be pre-designed to serve as an active component, e.g., electrodes, antennas, heat circuit, etc.

Applications

Depending on the size of pore, nanoporous graphene can find different applications in different areas.

Nanoporous graphene with a few to several tens of nm can be used for molecular diagnostics. Nanoporous graphene with pores of size up to several hundred nm or even μm can be used as permeation membrane. They can also find substantial potential in energy devices, e.g., supercapacitors and lithium-ion batteries. If the pore size, morphology, density, and distribution of nanoporous graphene can be controlled, and integrated into specific device structures, more advanced and sophisticated applications can be realized.

Graphene is well known as a semimetal with a zero bandgap. With periodic pore array, the corresponding nanoporous graphene will become a topological metasurface exhibiting a topological bandgap, and is expected to be applicable for further development into ultra-low power consumption, highly integrated, and robust active photonic systems at deep-subwavelength scale for applications in quantum communications and information processing.

Further, nanoporous graphene find pronounced applications in plasmonic sensing devices. A special double-sided plasmonic metasurface with nanoporous graphene for simultaneous biomolecular separation and SERS detection has been reported.

The present disclosure of fabrication of nanoporous graphene membrane with controllable pore size, morphology, density and distribution can significantly accelerate the development and realization of potential of nanoporous graphene membrane in both conventional and advanced applications.

CLOSING STATEMENT

The descriptions and examples herein are intended as non-limiting examples to serve to demonstrate the disclosed technology and can be modified by one having ordinary skill in the art to which the claimed invention pertains within the scope of the subject matter of the claimed invention. On the other hand, the present invention is not limited by the examples disclosed in the specification of the subject application, and the scope of the present invention should be interpreted based on the claims, and to include all techniques that are within the equivalent scope.

From the foregoing, it will be appreciated that various embodiments of the present disclosure have been described herein for purposes of illustration. The present invention is not limited necessarily to the embodiments specifically disclosed, but that substitutions, modifications, and variations may be made to the present invention and its uses without departing from the spirit and scope of the invention. Accordingly, the various embodiments disclosed herein are not intended to be limiting, with the true scope and spirit being indicated by the following claims.

What is claimed is:

1. A method for fabrication of a nanoporous graphene membrane, comprising:

printing nanopillars of a removable material on a substrate;

growing a graphene layer on the substrate to surround and contact side surfaces of the nanopillars, an uppermost surface of the graphene layer being at a lower level than uppermost surfaces of the nanopillars and a lowermost surface of the graphene layer being at a same level as lowermost surfaces of the nanopillars; and removing the nanopillars and the substrate to produce the nanoporous graphene membrane, wherein the nanopillars have a diameter in a range from 1 nm to 1000 nm, and a height in a range from 100 nm to 10,000 nm, and wherein the nanopillars have at least one of a cylindrical shape and a conical shape.

2. The method of claim 1, wherein the substrate comprises a material selected from one or more of Ni, Cu and transition metals, thereby facilitating and/or catalysing graphene growth.

3. The method of claim 1, wherein the removable material printed as nanopillars is removable by one or more of a solvent, heat, chemical treatment, and physical treatment.

4. The method of claim 1, wherein the printing the nanopillars comprises:

printing or depositing the nanopillars using 3D printing, nano-imprint, dip-pen lithography, laser writing and any printing technique, at an aspect ratio having a height-to-width ratio of 3 to 100.

5. The method of claim 1, further comprising synthesizing a graphene overlayer.

6. The method of claim 1, further comprising synthesizing a graphene overlayer by chemical vapor deposition.

7. The method of claim 1, further comprising:

before removing the nanopillars and the substrate, depositing a supporting layer onto the graphene layer, wherein the supporting layer comprises a metal, or a combination of metal and another material, and wherein an uppermost surface of the supporting layer is at a lower level than the uppermost surfaces of the nanopillars.

8. The method of claim 1, further comprising:

depositing a supporting layer onto the graphene layer, wherein the supporting layer comprises a non-metal, or a combination of a non-metal and another material.

9. The method of claim 1, further comprising:

depositing a supporting layer onto the graphene layer, wherein the supporting layer comprises an organic material or an organic material and another material.

10. The method of claim 1, further comprising:

depositing a supporting layer onto the graphene layer, wherein the supporting layer comprises a non-organic material or a non-organic material and another material.

11. The method of claim 1, further comprising:

depositing an additional overlayer or a stack of overlayers onto the graphene layer or a supporting layer, wherein the additional overlayer comprises a metal, or a combination of metal and another material.

12. The method of claim 1, further comprising:

depositing an additional overlayer or a stack of overlayers onto the graphene layer or a supporting layer, wherein the additional overlayer comprises a non-metal, or a combination of a non-metal and another material.

13. The method of claim 1, further comprising:

depositing an additional overlayer or a stack of overlayers onto the graphene layer or a supporting layer, wherein the additional overlayer comprises an organic material or an organic material and another material.

14. The method of claim 1, further comprising:

depositing an additional overlayer or a stack of overlayers onto the graphene layer or a supporting layer, wherein the additional overlayer comprises a non-organic material or a non-organic material and another material.

\* \* \* \* \*